(12) United States Patent
Duan et al.

(10) Patent No.: US 8,030,161 B2
(45) Date of Patent: Oct. 4, 2011

(54) GATE ELECTRODE FOR A NONVOLATILE MEMORY CELL

(75) Inventors: Xiangfeng Duan, Los Angeles, CA (US); Jian Chen, Mountain View, CA (US); J. Wallace Parce, Palo Alto, CA (US); Francisco A. Leon, Palo Alto, CA (US)

(73) Assignee: Nanosys, Inc., Palo Alto, CA (US)

( * ) Notice: Subject to any disclaimer, the term of this patent is extended or adjusted under 35 U.S.C. 154(b) by 574 days.

(21) Appl. No.: 12/121,591

(22) Filed: May 15, 2008

(65) Prior Publication Data

US 2008/0290394 A1    Nov. 27, 2008

Related U.S. Application Data

(60) Provisional application No. 60/962,899, filed on Aug. 1, 2007, provisional application No. 60/931,488, filed on May 23, 2007.

(51) Int. Cl.
*H01L 21/336* (2006.01)
*H01L 29/788* (2006.01)

(52) U.S. Cl. ........................................ 438/260; 257/317

(58) Field of Classification Search ................... 438/257, 438/260–267; 257/316–320
See application file for complete search history.

(56) References Cited

U.S. PATENT DOCUMENTS

| | | | |
|---|---|---|---|
| 5,557,123 A | 9/1996 | Ohta | |
| 5,768,192 A | 6/1998 | Eitan | |
| 5,973,353 A | 10/1999 | Yang et al. | |
| 6,091,120 A | 7/2000 | Yeom et al. | |
| 6,313,498 B1 | 11/2001 | Chen | |
| 6,664,604 B1 | 12/2003 | Besser et al. | |
| 6,885,586 B2 | 4/2005 | Chen et al. | |
| 2006/0105525 A1* | 5/2006 | Kim et al. | 438/257 |
| 2006/0118858 A1 | 6/2006 | Jeon et al. | |
| 2006/0163656 A1 | 7/2006 | Rim | |
| 2006/0198216 A1* | 9/2006 | Park et al. | 365/200 |
| 2007/0045715 A1 | 3/2007 | Sudo et al. | |
| 2007/0108498 A1* | 5/2007 | Lee et al. | 257/315 |

OTHER PUBLICATIONS

Clementi, C.; Bez, R.; Olivetti, V.C. "Non Volatile Memory Technologies: Floating Gate Concept Evolution," *Mater. Res. Soc. Symp. Proc.*, 2005, 830, pp. D1.2.1-D1.2.12.

Dimitrakis, P.; Normand, P. "Semiconductor Nanocrystal Floating-gate Memory Devices," *Mater. Res. Soc. Symp. Proc.*, 2005, 830, pp. D5.1.1-D5.1.14.

(Continued)

*Primary Examiner* — Calvin Lee
(74) *Attorney, Agent, or Firm* — Brinks Hofer Gilson & Lione

(57) ABSTRACT

A nonvolatile memory cell includes a substrate comprising a source, drain, and channel between the source and the drain. A tunnel dielectric layer overlies the channel, and a localized charge storage layer is disposed between the tunnel dielectric layer and a control dielectric layer. A gate electrode has a first surface adjacent to the control dielectric layer, and the first surface includes a midsection and two edge portions. According to one embodiment, the midsection defines a plane, and at least one edge portion extends away from the plane. Preferably, the edge portion extending away from the plane converges toward an opposing second surface of the gate electrode. According to another embodiment, the gate electrode of the nonvolatile memory cell includes a first sublayer and a second sublayer of a different width on the first sublayer.

20 Claims, 12 Drawing Sheets

OTHER PUBLICATIONS

Fazio, A. "Flash Memory Scaling," *MRS Bulletin*, 2004, 29(11), pp. 814-817.

Goronkin, H.; Yang. Y. "High-Performance Emerging Solid-State Memory Technologies," *MRS Bulletin*, 2004, 29(11), pp. 805-813.

Jeong, H.; Kim, K. "Prospect of Emerging Nonvolatile Memories," *Mater. Res. Soc. Symp. Proc.*, 2005, 830, pp. D7.6.1-D7.6.9.

Nafis, S.; Owyang, J.; Chatterji, S. "The Thin-film Landscape for ALD Processing," *Solid State Technology*, 2006, 49(5), 8 pages.

Power, J.R.; Gong, Y.; Tempel, G.; Andersen, E.O.; Langheinrich, W.: Shum, D.; Strenz, R. "Improved Reliability of a High-k IPD Flash Cell Through Use of a Top-oxide," *2007 22$^{nd}$ IEEE Non-Volatile Semiconductor Memory Workshop*, IEEE, Piscataway, New Jersey, USA, 2007, pp. 27-29.

Prall, K. "Scaling Non-Volatile Memory Below 30nm," *2007 22$^{nd}$ IEEE Non-Volatile Semiconductor Memory Workshop*, IEEE Piscataway, New Jersey, USA, 2007, pp. 5-10.

Silva, H.; Kim, M.K.; Avci, U.; Kumar, A.; Tiwari, S. "Nonvolatile Silicon Memory at the Nanoscale," *MRS Bulletin*, 2004, 29(11), pp. 845-851.

Van Houdt, J.; Wouters, D. "Memory Technology: Where is it Going?" Semiconductor International, Dec. 1, 2006, 6 pages.

*Silicon Processing for the VLSI Era*, Lattice Press, Sunset Beach, California, USA, 2002, pp. 145-147.

* cited by examiner

GATE ELECTRODE FOR A NONVOLATILE MEMORY CELL

RELATED APPLICATIONS

The present patent document claims the benefit of the filing date under 35 U.S.C. § 119(e) of U.S. Provisional Patent Application Ser. No. 60/962,899, filed Aug. 1, 2007, and U.S. Provisional Patent Application Ser. No. 60/931,488, filed May 23, 2007, which are hereby incorporated by reference in their entirety.

TECHNICAL FIELD

The present disclosure relates to memory devices, and more particularly, to nonvolatile memory devices.

BACKGROUND OF THE INVENTION

Nonvolatile memory devices, such as flash memory devices, are memory devices that can store information even when not powered. A flash memory device stores information in a charge storage layer that is separated from a "control gate." A voltage is applied to the control gate to program and erase the memory device by causing electrons to be stored in and discharged from the charge storage layer.

To reduce the dimensions of nonvolatile memory devices, the use of localized charge storage is being investigated and commercialized as a replacement for the more established contiguous floating gate technology. Localized charge storage approaches include the use of nitride films, semiconductor quantum dots, and metallic quantum dots. Localized charge storage may provide advantages over contiguous floating gate technology in several areas. For example, localized storage may provide greater immunity to cell-to-cell coupling, improved data retention, and allow further size scaling of the tunnel oxide layer.

For some types of localized charge storage memory devices, the charging and discharging of the charge storage layer is accomplished by electron (or hole) tunneling. Conventional memory cell technology includes gate electrodes and silicon channels with sharp corners. Such sharp corners can create locally enhanced electric fields and, consequently, spatial variations in the tunneling rate during charging and/or discharging of the memory device. Such variations in tunneling rate across the memory cell may be particularly problematic in memory devices that utilize localized charge storage approaches.

For example, locally increased tunneling rates may be detrimental during the cell erase process. In the erase process, a negative voltage is applied to the control gate to induce electrons to tunnel out of the charge storage layer. Due to the sharp corners of the gate electrode, however, the local electric field may be enhanced sufficiently such that electrons tunnel into the charge storage layer from the control gate at the cell edges. Consequently, during the erase process, electrons may be added at the edges of the cell as they are being removed from the center of the cell. The electrons thus stored at the edges of the cell cannot easily be removed from the charge storage layer because they are in fact caused by the erase procedure.

In view of these problems, it would be advantageous to reduce spatial variations in the tunneling rate across the memory cell, particularly for nonvolatile memory devices that store charge in discrete or localized regions within the charge storage layer.

BRIEF SUMMARY OF THE INVENTION

Described herein is a nonvolatile memory cell and a gate electrode designed to reduce or eliminate spatial variations in tunneling rate across the memory cell. A method of forming the nonvolatile memory cell is also described.

According to one embodiment, the nonvolatile memory cell includes a substrate comprising a source, a drain, and a channel between the source and the drain. A first dielectric layer overlies the channel, and a localized charge storage layer is disposed between the first dielectric layer and a second dielectric layer. A gate electrode has a first surface adjacent to the second dielectric layer. The first surface includes a midsection and two edge portions. The midsection defines a plane, and at least one of the edge portions extends away from the plane.

According to another embodiment, the nonvolatile memory cell includes a substrate comprising a source, a drain, and a channel between the source and the drain, and a dielectric layer including discontinuous charge storage elements disposed on the substrate. A gate electrode has a first surface adjacent to the dielectric layer and an opposing second surface. The first surface includes a midsection between two edge portions. The two edge portions converge toward the opposing second surface.

According to another embodiment, the nonvolatile memory cell includes a substrate comprising a source, a drain, and a channel between the source and the drain, and a first dielectric layer overlying the channel. A localized charge storage layer is disposed between the first dielectric layer and a second dielectric layer. A gate electrode is adjacent to the second dielectric layer. The substrate includes a surface adjacent to the first dielectric layer. The surface includes a midsection and two edge portions. The midsection defines a plane, and at least one edge portion extends away from the plane.

According to one aspect, a method of forming a nonvolatile memory cell includes forming a first dielectric layer on the substrate and forming a localized charge storage layer on the first dielectric layer. A second dielectric layer is formed on the localized charge storage layer, and a gate electrode layer is formed on the second dielectric layer. A gate electrode is formed from the gate electrode layer. The gate electrode includes a first surface adjacent to the second dielectric layer. The first surface has a midsection and two edge portions. The midsection defines a plane and the two edge portions extend away from the plane.

According to another aspect, a method of forming a nonvolatile memory cell includes forming a dielectric layer on a substrate and including discontinuous charge storage elements within the dielectric layer. A gate electrode layer is formed on the dielectric layer, and a gate electrode is formed from the gate electrode layer. The gate electrode includes a first surface adjacent to the dielectric layer. The first surface has a midsection and two edge portions. The midsection defines a plane and the two edge portions extend away from the plane.

According to another aspect, a method of forming a nonvolatile memory cell includes forming a first dielectric layer on the substrate and forming a localized charge storage layer on the first dielectric layer. A second dielectric layer is formed on the localized charge storage layer, and a gate electrode layer comprising blunted interior junctions is formed on the second dielectric layer. A gate electrode is formed from the gate electrode layer comprising the blunted interior junctions. The gate electrode includes a first surface adjacent to the second dielectric layer. The first surface has a midsection and two edge portions. The midsection defines a plane and the two edge portions extend away from the plane.

According to another embodiment, the memory cell includes a substrate comprising a source, a drain, and a channel between the source and the drain. A first dielectric layer overlies the channel, and a localized charge storage layer is disposed between the first dielectric layer and a second dielectric layer. A gate electrode is adjacent to the second dielectric layer. The gate electrode includes a first sublayer and a second sublayer on the first sublayer. A width of the first sublayer is different from a width of the second sublayer.

According to one embodiment, the gate electrode for the nonvolatile memory cell includes a first sublayer and a second sublayer on the first sublayer. A width of the second sublayer is different from a width of the first sublayer, and at least one of the first sublayer and the second sublayer has a nonuniform width across a thickness thereof.

According to another embodiment, the gate electrode for the nonvolatile memory cell includes a first sublayer, a second sublayer adjacent to the first sublayer, and an intermediate sublayer between the first sublayer and the second sublayer. A width of the intermediate sublayer is different from a width of the first sublayer and different from a width of the second sublayer.

According to one aspect, the method of forming a nonvolatile memory cell includes forming a first dielectric layer on the substrate, forming a localized charge storage layer on the first dielectric layer, and forming a second dielectric layer on the localized charge storage layer. A first conductive layer is then formed on the second dielectric layer, and a second conductive layer is formed on the first conductive layer. A multilayer gate electrode including a first sublayer and a second sublayer on the first sublayer is formed from the first and second conductive layers. A width of the first sublayer is different from a width of the second sublayer.

DETAILED DESCRIPTION OF THE INVENTION

It should be appreciated that the particular implementations shown and described herein are exemplary and are not intended to otherwise limit the scope of the present invention in any way. Indeed, for the sake of brevity, conventional electronics, manufacturing, semiconductor devices, and other functional aspects of the systems (and components of the individual operating components of the systems) may not be described in detail herein.

It should be understood that the spatial descriptions (e.g., "above," "below," "up," "down," "top," "bottom," etc.) made herein are for purposes of illustration only, and that devices described herein can be spatially arranged in any orientation or manner.

In addition, the terms "adjacent," "on," "over," and "overlying," as used herein to describe the relationship of one layer to another layer, are intended to be interpreted broadly to include layers in direct contact with one another and layers spaced apart by one or more intervening layers. Similarly, the term "between" is intended to be interpreted broadly to include a layer that is directly between two other layers or spaced apart from two other layers but still intermediate the two other layers.

As used herein, a localized charge storage layer broadly refers to a charge storage layer including one or more localized charge traps or a plurality of discrete charge storage elements, such as nanocrystals.

Figure 1:
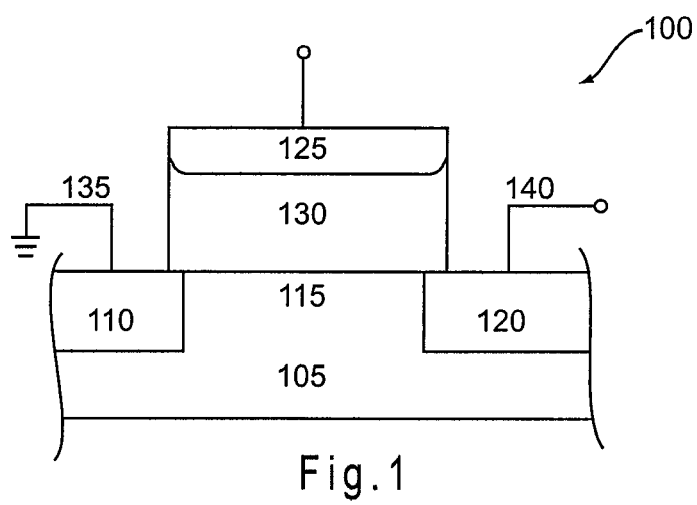
FIG. 1 is a cross-sectional view of a memory cell according to a first embodiment.

FIG. 1 shows a detailed cross-sectional view of a memory cell 100, according to an exemplary embodiment. The memory cell 100 includes a substrate 105 having a source region 110, a drain region 120, and a channel region 115 between the source region 110 and the drain region 120. The memory cell 100 further includes a control gate or gate electrode 125, a gate stack 130, a source contact 135, a drain contact 140. The source region 110, channel region 115, and drain region 120 are configured generally similar to a transistor configuration. The gate stack 130 is formed on the channel region 115, and includes a charge storage layer and additional features, as further described below. The gate electrode 125 is formed on the gate stack 130 and will be described in more detail below.

In the current embodiment, the substrate 105 is a semiconductor type substrate, and is formed to have either P-type or N-type conductivity, at least in the channel region 115. The gate electrode 125, source contact 135, and drain contact 140 provide electrical connectivity to the memory cell 100. The source contact 135 is formed in contact with the source region 110. The drain contact 140 is formed in contact with the drain region 120. The source and drain regions 110 and 120 are typically doped regions of the substrate 105 that have a conductivity different from that of the channel region 115.

As shown in FIG. 1, the source contact 135 is coupled to a potential, such as a ground potential. The drain contact 140 is coupled to another signal. Note that the source and drain regions 110 and 120 are interchangeable, and their interconnections may be reversed.

The memory cell 100 may be programmed by applying appropriate voltages to the source region 110, drain region 120, and gate electrode 125 of the memory structure for an appropriate time period. Electrons may thereby be caused to tunnel or be injected (e.g., via channel hot electrons) from the channel region 115 to the charge storage layer (described below) in the gate stack 130. The charge storage layer is thereby "charged." The charge stored in the charge storage layer sets the memory transistor to a logical "1" or "0." Depending on whether the memory cell 100 includes an enhancement or depletion transistor structure, when the charge storage layer is positively charged or contains electrons (negative charge), the memory cell will or will not conduct during a read operation. When the charge storage layer is neutral (or positively charged) or has an absence of negative charge, the memory cell will conduct during a read operation by a proper choice of the gate voltage. The conducting or non-conducting state is output as the appropriate logical level. "Erasing" is the process of transferring electrons from the charge storage layer (or holes to the charge storage layer) (e.g., charge trapping layer). "Programming" is the process of transferring electrons onto the charge storage layer, where they are stored.

Figures 2A, 2B:
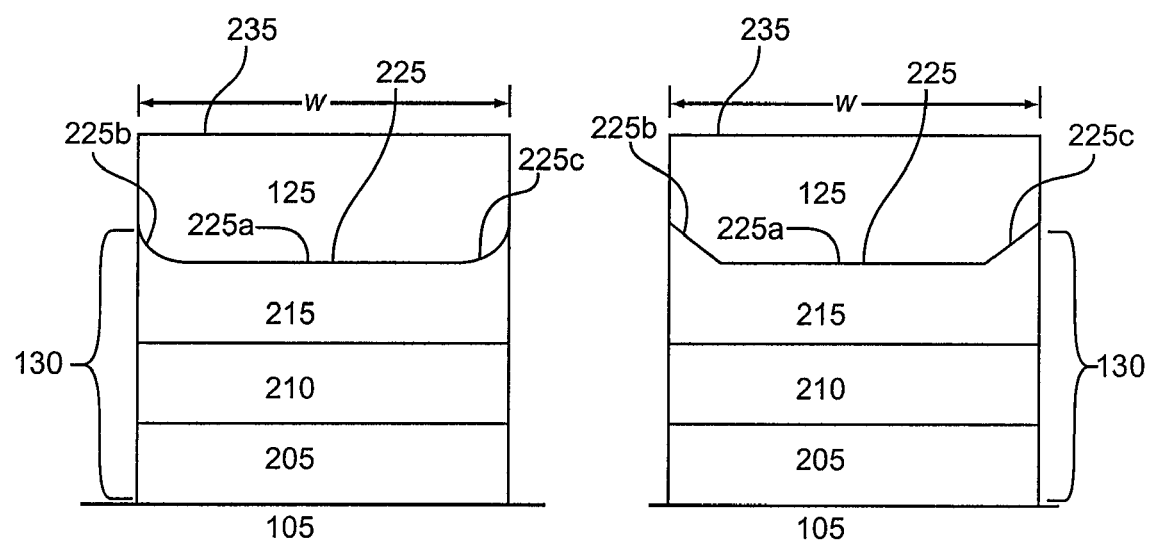
FIG. 2A is a cross-sectional view, taken along the bit line direction, of a gate electrode and gate stack of the memory cell according to the first embodiment.
FIG. 2B is a cross-sectional view, taken along the bit line direction, of the gate electrode and gate stack of the memory cell according to a second embodiment.

FIG. 2A shows a cross-sectional view, taken along the bit line direction, of the gate stack of the memory cell according to a first embodiment. The cross sections corresponding to the bit line direction (BL) and word line direction (WL) are demarcated in FIG. 9, which presents a plan view perspective of two adjacent memory cells 100. The bit line direction is substantially orthogonal to the word line direction.

Referring to FIG. 2A, the gate stack 130 includes a tunneling dielectric layer 205, a charge storage layer 210, and a control dielectric layer 215. In the example of FIG. 2A, the tunneling dielectric layer 205 is formed on the channel region (shown in FIG. 1) of the substrate 105 of the memory cell 100. The charge storage layer 210 is formed on the tunneling dielectric layer 205. The control dielectric layer 215 is formed on the charge storage layer 210. The gate electrode 125 is formed on the control dielectric layer 215. Note that in exemplary embodiments, one or more further layers of material may separate the layers of the gate stack 130 and/or may separate the gate stack 130 from the substrate 105 and/or the gate electrode 125.

According to one embodiment, a first surface 225 of the gate electrode 125 is adjacent to the control dielectric layer 215. As shown in FIG. 2A, the first surface 225 may be directly adjacent to (i.e., in contact with) the control dielectric layer 215. Alternatively, one or more intervening layers may be present, such as, for example, a charge blocking layer as described in pending U.S. application Ser. No. 11/688,087, which was filed on Mar. 19, 2007 and is hereby incorporated by reference.

The first surface 225 of the gate electrode 125 includes a midsection 225a and edges 225b, 225c on either side of the midsection 225a, as shown in FIG. 2A. The midsection 225a defines a plane that is generally aligned with the substrate 105. The edges 225b, 225c extend away from, or diverge from, the plane defined by the midsection 225a, and extend along the word line direction (into the page). Preferably, the edges 225b, 225c converge toward a second surface 235 of the gate electrode 125. Accordingly, the gate electrode 125 may have a nonuniform thickness along its width w. Such a configuration may be advantageous to reduce variations in electron tunneling across the memory cell 100.

Preferably, the midsection 225a of the gate electrode 125 extends over a majority of the width w of the gate electrode layer 125. For example, the midsection 225a may span from about 51% to about 98% of the width w. Accordingly, the edges 225b, 225c may span from about 2% to about 49% of the width w. Preferably, the midsection 225a spans from about 70% to about 90% of the width w of the gate electrode 125. Accordingly, it is preferred that the edges 225b, 225c span from about 10% to about 30% of the width w. Each of the edges preferably extends over the same distance. For example, edge 225b may span from about 5% to about 15% of the width w of the gate electrode 125, and the opposing edge 225c may span from about 5% to about 15% of the width w on the other side of the midsection 225a. Alternatively, the edges may span different distances.

As shown in FIG. 2A, the edges 225b, 225c of the first surface 225 of the gate electrode 125 may extend away from the plane defined by the midsection 225a in a nonlinear manner. According to this exemplary embodiment, each edge 225b, 225c may include a curve. For example, the curve of one or both edges 225b, 225c may generally correspond to a portion of a circle (an arc) and have a radius of curvature of between about 5 nm and 500 nm. According to one exemplary embodiment, the radius of curvature of one edge (e.g., 225b) is substantially the same as the radius of curvature of the opposing edge (e.g., 225c). Alternatively, the radii of curvature of the edges 225b, 225c may be different. It is also contemplated that one or both edges 225b, 225c may be nonuniformly curved.

According to a second embodiment shown in FIG. 2B, the edges 225b, 225c of the first surface 225 of the gate electrode 125 may extend away from the plane defined by the midsection 225a in a substantially linear manner. According to this exemplary embodiment, each edge 225b, 225c may have a slope. For example, one edge (e.g., 225c) may have a slope of between about 0.1 and 10 and the opposing edge (e.g., 225b) may have a slope of between about −0.1 and −10. Preferably, one edge has a slope of between about 0.5 and about 2.0, and the opposing edge has a slope of between about −0.5 and about −2.0. According to one exemplary embodiment, the absolute value of the slope of one edge is substantially the same as the absolute value of the slope of the opposing edge. Alternatively, the absolute values of the slopes may be different.

Figure 3A:
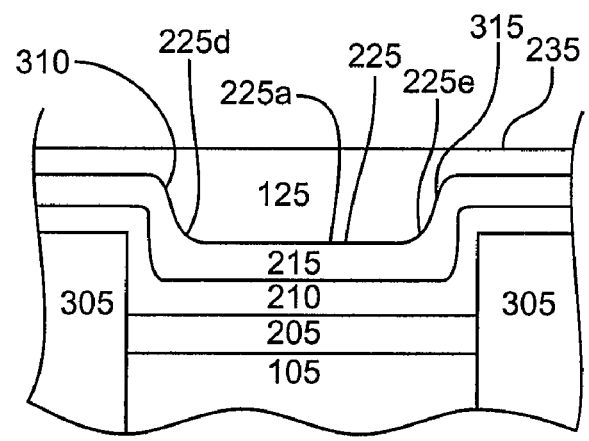
FIG. 3A is a cross-sectional view, taken along the word line direction, of the gate electrode and gate stack of the memory cell according to a first embodiment.
Figure 3B:
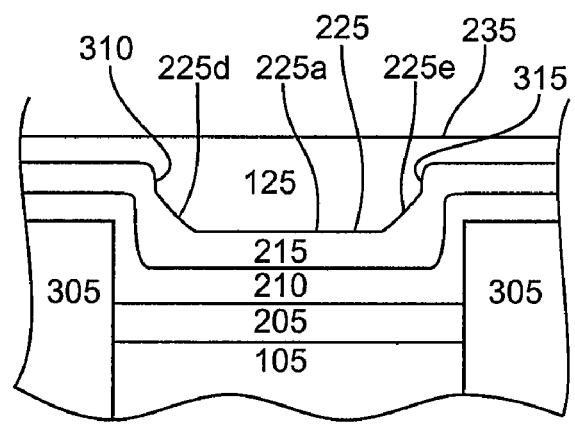
FIG. 3B is a cross-sectional view, taken along the word line direction, of the gate electrode and gate stack of the memory cell according to a second embodiment.
Figure 3C:
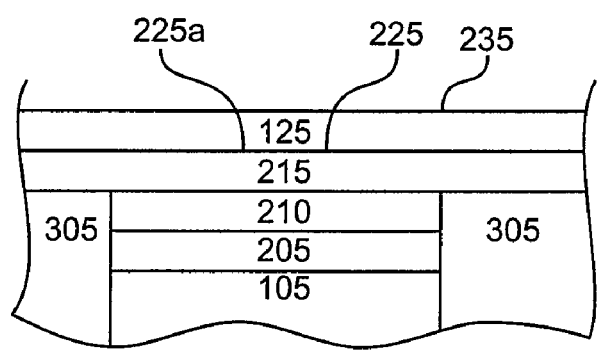
FIG. 3C is a cross-sectional view, taken along the word line direction, of the gate electrode and gate stack of the memory cell according to a third embodiment.

FIGS. 3A-3C show cross-sectional views, taken along the word line direction, of the memory cell 100 according to several alternative embodiments. As in the previous embodiments, the tunneling dielectric layer 205 is formed on the substrate 105 of the memory cell 100 overlying the channel 115, shown in FIG. 1. The charge storage layer 210 is formed on the tunneling dielectric layer 205. The control dielectric layer 215 is formed on the charge storage layer 210. The gate electrode 125 is formed on the tunneling dielectric layer 205. Isolation structures 305 are disposed on either side of the memory cell 100.

Referring to FIG. 3A, the gate electrode 125 has a lower surface 225 including a midsection 225a and sidewall regions 310, 315 within each memory cell. At the junctions of the midsection 225a and the sidewall regions 310, 315 are blunt interior junction regions 225d, 225e. The blunt interior junction regions 225d, 225e are portions of the lower surface 225 that extend away from the plane defined by the midsection 225a and extend along the bit line direction (into the page).

Preferably, the blunt interior junction regions 225d, 225e converge toward a second surface 235 of the control gate layer 125. Accordingly, the gate electrode layer 125 may have a nonuniform thickness along a length of the memory cell 100.

As shown in FIG. 3A, the blunt interior junction regions 225d, 225e of the lower surface 225 may extend away from the plane defined by the midsection 225a in a nonlinear manner. According to this first exemplary embodiment, each interior junction region 225d, 225e may include a curve. For example, when viewed in cross-section, the curve of one or both interior junction regions 225d, 225e may generally correspond to a portion of a circle (an arc) and have a radius of curvature of between about 5 nm and 500 nm. The radius of curvature of one interior junction region (e.g., 225d) may be substantially the same as the radius of curvature of the opposing interior junction region (e.g., 225e). Alternatively, the radii of curvature of the interior junction regions 225d, 225e may be different. It is also contemplated that one or both interior junction regions 225d, 225e may be nonuniformly curved.

As shown in FIG. 3B, the interior junction regions 225d, 225e of the first surface 225 of the gate electrode 125 may extend away from the plane defined by the midsection 225a in a substantially linear manner. According to this second exemplary embodiment, each interior junction region 225d, 225e may have a slope. For example, one edge (e.g., 225e) may have a slope of between about 0.1 and 10 and the opposing edge (e.g., 225d) may have a slope of between about −0.1 and −10. Preferably, one edge has a slope of between about 0.5 and about 2.0, and the opposing edge has a slope of between about −0.5 and about −2.0. According to one exemplary embodiment, the absolute value of the slope of one edge is substantially the same as the absolute value of the slope of the opposing edge. Alternatively, the absolute values of the slopes may be different.

As shown in the third exemplary embodiment of FIG. 3C, the first surface 225 of the gate electrode 125 may be substantially flat or planar along the word line direction. Accordingly, the first surface 225 may not include the interior junction regions 225d, 225e.

Figure 12:
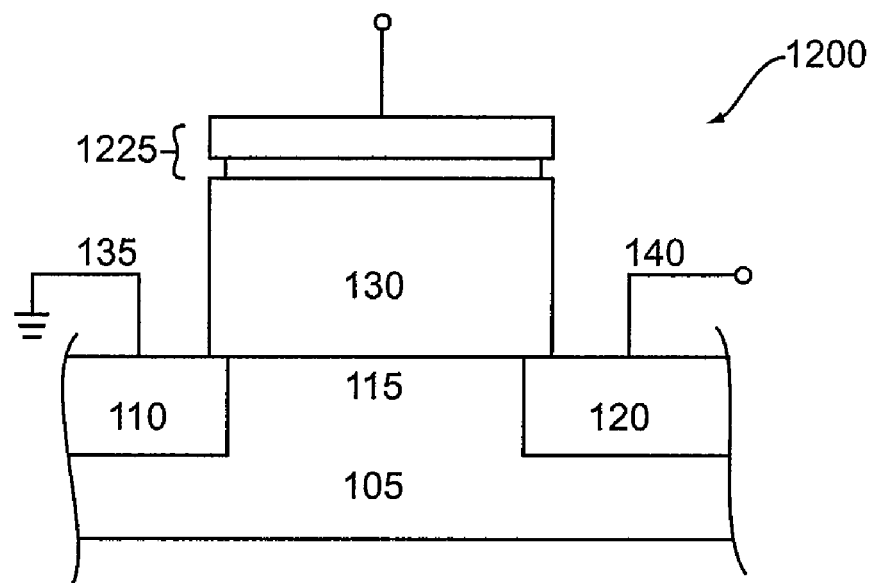
FIG. 12 is a cross-sectional view of a memory cell according to a fourth embodiment.

Referring to FIG. 12, an effect similar to providing curved or sloped edges of the first surface of the gate electrode may be achieved by forming the gate electrode from at least two sublayers of different widths. FIG. 12 shows a cross-sectional view of a nonvolatile memory cell 1200 including such a multilayer gate electrode 1225. The memory cell 1200 is otherwise as described previously in reference to FIG. 1.

Figure 13:
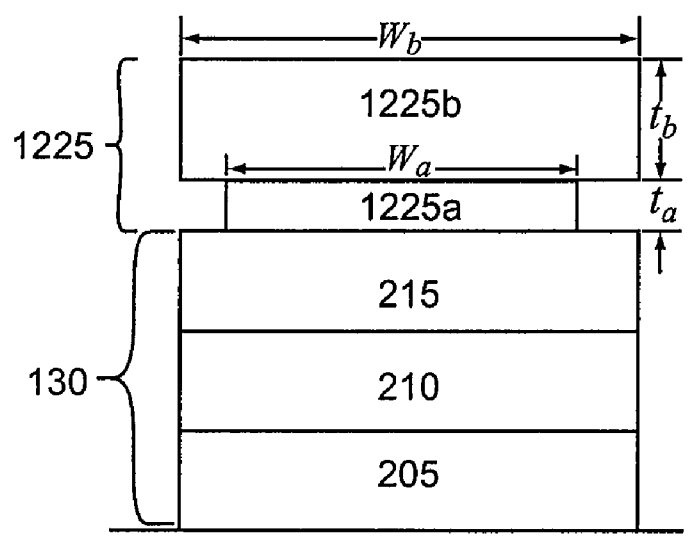
FIG. 13 is a cross-sectional view, taken along the bit line direction, of a gate electrode and gate stack of the memory cell of FIG. 12.

Referring to FIG. 13, which shows in greater detail the gate stack 130 and gate electrode 1225 of FIG. 12, the gate electrode 1225 may include a first sublayer 1225a and a second sublayer 1225b of different widths. The second sublayer 1225b is preferably disposed on the first sublayer 1225a and the gate stack 130. The first and second sublayers 1225a, 1225b may have an inverted stepped profile on at least one side of the gate electrode. Preferably, both sides of the first sublayer 1225a are recessed with respect to the second sublayer 1225b.

The width $w_b$ of the second sublayer 1225b is preferably greater than the width $w_a$ of the first sublayer 1225a. For example, the width $w_b$ of the second sublayer 1225b may be from about $t_a/4$ to about $4t_a$ greater than the width $w_a$ of the first sublayer 1225a, where $t_a$ is the thickness of the first sublayer 1225a. The width $w_b$ of the second sublayer 1225b may also be from about $t_a/2$ to about $2t_a$ greater than the width $w_a$ of the first sublayer 1225a. The thickness $t_a$ of the first sublayer may be in the range of from about 2 nm to about 25 nm, according to one embodiment, and thus the width $w_b$ of the second sublayer 1225b may be from about 0.5 nm to about 100 nm greater than the width $w_a$ of the first sublayer 1225a. Preferably, the width $w_b$ of the second sublayer 1225b is from about 1 nm to about 50 nm greater than the width $w_a$ of the first sublayer 1225a. The width $w_b$ of the second sublayer 1225b of the gate electrode 1225 may be in the range of from about 10 nm to about 100 nm.

Referring again to FIG. 13, the second sublayer 1225b may have a larger thickness $t_b$ than the thickness $t_a$ of the first sublayer 1225a. According to one embodiment, the thickness $t_b$ of the second sublayer 1225b may be from about five to about 50 times greater than the thickness $t_a$ of the first sublayer 1225a. Preferably, the thickness $t_b$ of the second sublayer 1225b is from about 10 to about 25 times greater than that of the first sublayer 1225a.

Figure 14:
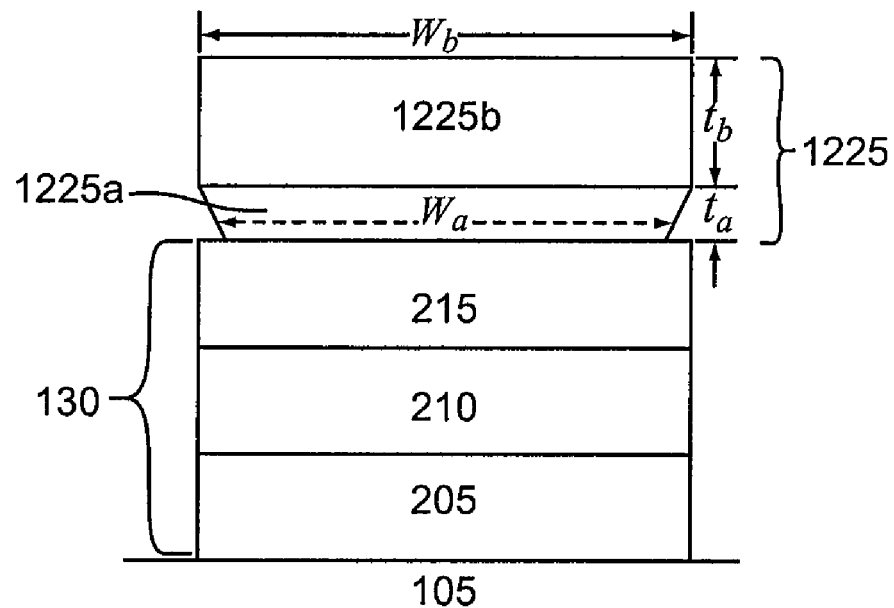
FIG. 14 is a cross-sectional view, taken along the bit line direction, of a gate electrode and gate stack according to one embodiment.

According to one embodiment, at least one of the sublayers of the gate electrode 1225 may have a nonuniform width across the thickness of the sublayer. For example, referring to FIG. 14, the width $w_a$ of the first sublayer 1225a may decrease in a direction away from the second sublayer 1225b. The decrease may be linear or nonlinear. A sublayer having a nonuniform width may include a composition gradient across the thickness thereof. For example, a concentration of at least one component of a material of the first sublayer 1225a may vary as a function of thickness $t_a$ of the first sublayer 1225a. Such a gradient of composition may affect the etch rate of the sublayer, as will be discussed further below.

Figure 15:
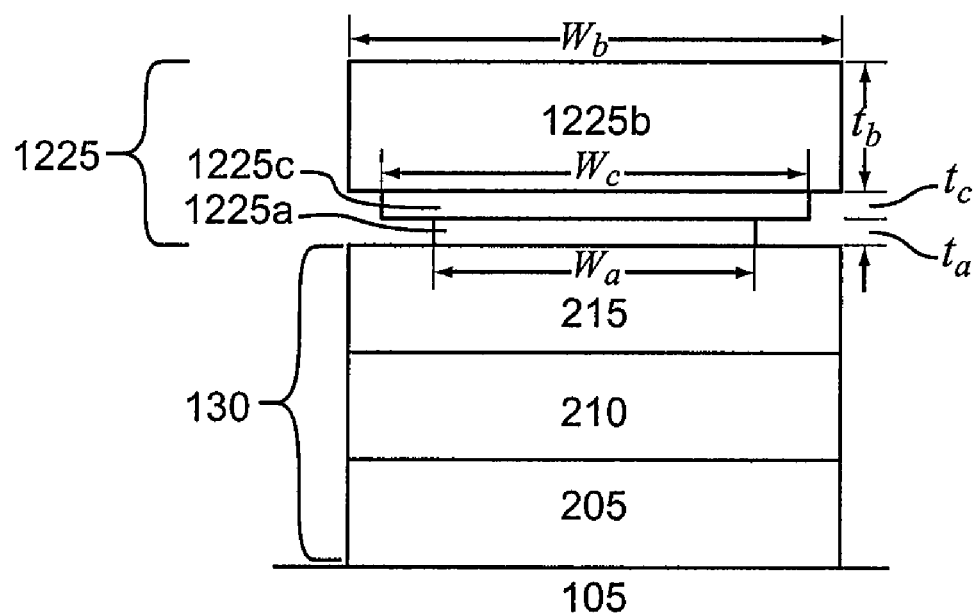
FIG. 15 is a cross-sectional view, taken along the bit line direction, of a gate electrode and gate stack according to another embodiment.

Referring to FIG. 15, the gate electrode 1225 of the nonvolatile memory cell 1200 may include three sublayers of different widths. For example, the gate electrode 1225 may include a first sublayer 1225a, a second sublayer 1225b, and an intermediate sublayer 1225c between the first sublayer 1225a and the second sublayer 1225b. The second sublayer 1225b overlies the first sublayer 1225a and the intermediate sublayer 1225c. The first, intermediate, and second sublayers 1225a, 1225c, 1225b may have an inverted stepped profile on at least one side of the gate electrode. Preferably, both sides of the first sublayer 1225a are recessed with respect to the intermediate sublayer 1225c. It is also preferred that both sides of the intermediate sublayer 1225c are recessed with respect to the second sublayer 1225b.

Preferably, the width $w_c$ of the intermediate sublayer 1225c is greater than the width $w_a$ of the first sublayer 1225a but smaller than the width $w_b$ of the second sublayer 1225b. For example, the width $w_c$ of the intermediate sublayer 1225c may be in the range of from about $t_a/4$ to about $4t_a$ greater than the width $w_a$ of the first sublayer 1225a, where $t_a$ is the thickness of the first sublayer 1225a. The width $w_c$ of the intermediate sublayer 1225c may also be in the range of from about $t_a/2$ to about $2t_a$ greater than the width $w_a$ of the first sublayer 1225a. Similarly, the width $w_c$ of the intermediate sublayer 1225c may be in the range of from about $t_c/4$ to about $4t_c$ less than the width $w_b$ of the second sublayer 1225b, where $t_c$ is the thickness of the intermediate sublayer 1225c. The width $w_c$ of the intermediate sublayer 1225c may also be in the range of from about $t_c/2$ to about $2t_c$ less than the width $w_b$ of the second sublayer 1225b. The thickness $t_a$ of the first sublayer 1225a may lie in the range of from about 2 nm to about 25 nm, and the thickness $t_c$ of the intermediate sublayer 1225c may lie in the range of from about 2 nm to about 25 nm. Thus, the width $w_c$ of the intermediate sublayer 1225c may be greater than the width $w_a$ of the first sublayer 1225a and smaller than the width $w_b$ of the second sublayer 1225b by an amount in the range of from about 0.5 nm to about 100 nm, or, more preferably, by an amount in the range of from about 1 nm to about 50 nm.

Referring again to FIG. 15, the second sublayer 1225b may have a thickness $t_b$ which is larger than each of the thickness $t_a$ of the first sublayer 1225a and the thickness $t_c$ of the intermediate sublayer 1225c. According to one embodiment, the thickness $t_b$ of the second sublayer 1225b may be from about five to about 50 times greater than the thickness $t_a$ of the first sublayer 1225a and from about five to 50 times greater than the thickness $t_c$ of the intermediate sublayer 1225c. Preferably, the thickness $t_b$ of the second sublayer 1225b is from about 10 to about 25 times greater than that of the first sublayer 1225a and from about 10 to about 25 times greater than that of the intermediate sublayer 1225c.

The gate electrode 1225 also may include more than three sublayers of different widths. For example, the gate electrode 1225 may include four, five, or six sublayers, and each may have a different width. Preferably, the widths of the sublayers increase in a direction away from the control dielectric layer 215 in order to produce an edge "rounding" effect of the gate electrode. The width of any or all of these sublayers may be nonuniform across a thickness of the sublayer, and any or all of the sublayers may include a composition gradient, as described above.

Generally, the thickness of the gate electrode layer 125, 1225 (including any sublayers) is in the range of from about 5 nm to about 5,000 nm. Preferably, the thickness is in the range of from about 10 nm to about 500 nm. For embodiments of the gate electrode 125 including curved or sloped edges 225b, 225c, the thickness of the gate electrode is preferably measured from a point within the midsection 225a.

The gate electrode 125, 1225 is preferably formed of a conductive material. The conductive material may be a semiconductor, metal, alloy or compound (e.g., a metal nitride). For example, the gate electrode 125, 1225 may be formed of polycrystalline silicon (polysilicon). In another example, the gate electrode 125, 1225 may be formed of a conductive material including one or more metals, such as, for example, one or more transition metals. Exemplary transition metals that may be suitable for the gate electrode 125, 1225 include, but are not limited to: Ti, V, Cr, Mn, Fe, Co, Ni, Cu, Zn, Zr, Nb, Mo, Ru, Rh, Pd, Ag, Cd, Hf, Ta, W, Re, Os, Ir, Pt, Au, and Hg. According to an exemplary embodiment, the gate electrode 125, 1225 may be formed of TaN, TiN, WN, or mixtures thereof.

According to embodiments in which the gate electrode includes a plurality of sublayers, each sublayer may be formed of a different conductive material. The conductive material may be a semiconductor, metal, alloy, or compound (e.g., a metal nitride) and may include one or more of Si, Ti, V, Cr, Mn, Fe, Co, Ni, Cu, Zn, Zr, Nb, Mo, Ru, Rh, Pd, Ag, Cd, Hf, Ta, W, Re, Os, Ir, Pt, Au, and Hg. It may be advantageous to select a p-type, high work function material providing a high tunneling barrier for the sublayer of the gate electrode 1225 closest to the control dielectric 215 (e.g., the first sublayer 1225a). It is believed that placing a high work function material near the control dielectric 215 may help to prevent charge leakage through the control dielectric 215 during the erase operation when a high negative voltage is applied to the gate electrode 125, 1225. Exemplary high work function materials include, for example, titanium nitride (TiN), tantalum nitride (TiN), tungsten nitride (WN), and ruthenium (Ru). According to one exemplary embodiment of the multilayer gate electrode 1225, the first sublayer 1225a may include Ru, TiN, or TaN; the intermediate sublayer 1225c may include WN; and the second sublayer 1225b may include W. According to another exemplary embodiment, the first sublayer 1225a may be formed of a mixture of TaN and TiN and have a composition gradient across the thickness thereof, and the second sublayer 1225b may include W.

The gate electrode layer 125, 1225, including any sublayers, may be deposited by vapor deposition techniques known in the art. Physical vapor deposition (PVD) techniques, such as sputtering or thermal evaporation, chemical vapor deposition (CVD), or atomic layer deposition (ALD) may be suitable for deposition of the gate electrode layer 125, 1225. ALD may be particularly suitable for depositing a gate electrode layer including a composition gradient and/or multiple sublayers. For example, to form a layer of a conductive material having at least one component that varies in concentration across a thickness of the layer, one or more first monolayers of the conductive material may be deposited using a first precursor of a first chemistry, and then one or more second monolayers of the conductive material may be deposited using a second precursor of a second chemistry, and then one or more third monolayers of the conductive material may be deposited using a third precursor of a third chemistry, etc. In other words, consecutive depositions of one or more monolayers may be carried out using different precursors in order to form the gate electrode layer including either a composition gradient or multiple layers. It is also envisioned that a layer of a uniform composition may be deposited initially and then a rapid thermal anneal (RTA) may be employed to achieve the effect of a compositionally graded layer.

According to embodiments in which the gate electrode 1225 has a multilayer structure, the sublayers of the gate electrode 1225 may have different etch rates. Accordingly, it may be possible to form sublayers of different widths during an etching process of the gate electrode layer. A sublayer having a higher etch rate may be etched to a smaller width during etching than an adjacent sublayer having a lower etch rate. Referring to FIG. 15, for example, the intermediate sublayer 1225c preferably has a higher etch rate than the second sublayer 1225b and a lower etch rate than the first sublayer 1225a. According to the embodiment of FIG. 13 in which the gate electrode 1225 includes two sublayers, it is preferable that the first sublayer 1225a has a higher etch rate than the second sublayer 1225b. Generally speaking, it is desirable that the etch rate of the sublayers of the gate electrode 1225 increases in a direction of the gate stack, such that the sublayer having the highest etch rate (and the smallest width) is the sublayer closest to the gate stack 130. The etch rate of a sublayer may be controlled by proper selection of the material or materials forming the sublayer for a given etching procedure and/or etch chemistry. For example, it is known that Ru can be readily etched in ozone, whereas Mo and W are more resistant to etching in ozone. At 150° C., Ru can be etched very quickly at a few hundred nanometers per minute while Mo and W remain intact.

Figure 11:
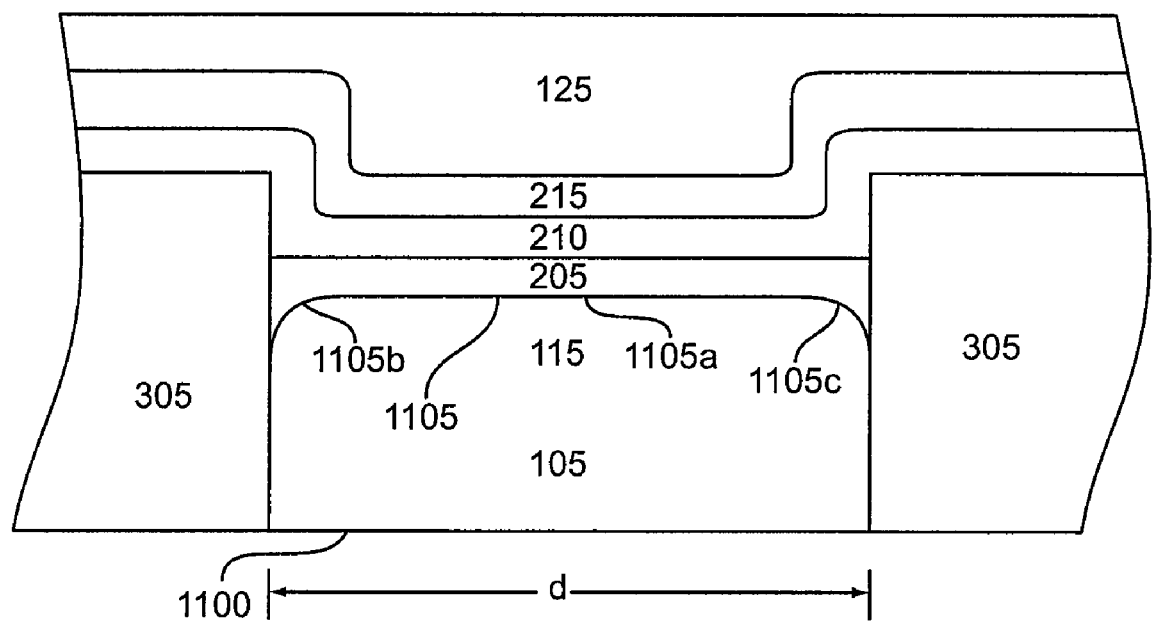
FIG. 11 is a cross-sectional view, taken along the word line direction, of a portion of the memory cell according to another embodiment.

According to another embodiment, to minimize localized tunneling effects it may be advantageous to provide curved or tapered channel edges of the substrate. FIG. 11 shows a cross-sectional view, taken along the word line direction, of a memory cell according to this embodiment. A tunneling dielectric layer 205, a charge storage layer 210, a control dielectric layer 215, and a gate electrode 125 are provided on a substrate 105 including a channel region 115. An upper surface 1105 of the substrate 105 includes a midsection 1105a and channel edges 1105b, 1105c on either side of the midsection 1105a, as shown in FIG. 11. The midsection 1105a defines a plane, and the channel edges 1105b, 1105c extend away from, or diverge from, the plane. The channel edges 1105b, 1105c extend along the bit line direction (into the page). Preferably, the edges 1105b, 1105c converge toward a lower surface 1100 of the substrate 105.

Preferably, the midsection 1105a extends over a majority of a distance d of the channel region 115. For example, the midsection 1105a may span from about 51% to about 98% of the distance d. Accordingly, the edges 1105b, 1105c may span from about 2% to about 49% of the distance d. Preferably, the midsection 1105a spans from about 70% to about 90% of the distance d. Accordingly, it is preferred that the edges 1105b, 1105c span from about 10% to about 30% of the distance d. Each of the edges preferably extends over the same distance. For example, edge 1105b may span from about 5% to about 15% of the distance d, and the opposing edge 1105c may span from about 5% to about 15% of the distance d on the other side of the midsection 1105a. Alternatively, the edges may span different distances.

As shown in FIG. 11, the edges 1105b, 1105c of the upper surface 1105 of the substrate 105 may extend away from the plane defined by the midsection 1105a in a nonlinear manner. According to this exemplary embodiment, each edge 1105b, 1105c may include a curve. For example, the curve of one or both edges 1105b, 1105c may generally correspond to a portion of a circle (an arc) and have a radius of curvature of between about 5 nm and 500 nm. According to one exemplary embodiment, the radius of curvature of one edge (e.g., 1105b) is substantially the same as the radius of curvature of the opposing edge (e.g., 1105c). Alternatively, the radii of curvature of the edges 1105b, 1105c may be different. It is also contemplated that one or both edges 1105b, 1105c may be nonuniformly curved.

According to a second embodiment, the edges 1105b, 1105c of the upper surface of the substrate 105 may extend away from the plane defined by the midsection 1105a in a substantially linear manner. According to this exemplary embodiment, each edge 1105b, 1105c may have a slope. For example, one edge (e.g., 1105c) may have a slope of between about 0.1 and 10 and the opposing edge (e.g., 1105b) may have a slope of between about −0.1 and −10. Preferably, one edge has a slope of between about 0.5 and about 2.0, and the opposing edge has a slope of between about −0.5 and about −2.0. According to one exemplary embodiment, the absolute value of the slope of one edge is substantially the same as the absolute value of the slope of the opposing edge. Alternatively, the absolute values of the slopes may be different.

The memory cell may include any type of charge storage layer or charge storage medium. Exemplary charge storage layers are described below. Preferably, the charge storage layer is a localized charge storage layer.

The charge storage layer 210 stores a positive or negative charge to indicate a programmed state of the memory cell 100, as described above. During programming, a voltage applied to the gate electrode 125 creates an electric field that causes electrons to tunnel (or be injected via hot electron injection) into the charge storage layer 210 from the channel region 115 through the tunneling dielectric layer 205. The resulting negative charge stored in the charge storage layer 210 shifts a threshold voltage of the memory cell 100. The charge remains in the charge storage layer 210 even after the voltage is removed from the gate electrode 125. During an erase process, an oppositely charged voltage may be applied to the gate electrode 125 to cause electrons to discharge from the charge storage layer 210 to the substrate 105 through the tunneling dielectric layer 205 or to draw holes from the channel 115 to tunnel through (or via channel hot holes) the tunnel dielectric layer 205 to the charge storage layer 210. The control dielectric layer 215 isolates the gate electrode 125 from the charge storage layer 210.

The charge storage layer 210 may include any type of charge storage medium. Preferably, the charge storage layer 210 includes one or more localized charge traps, as discussed further below, or a plurality of discrete charge storage elements, such as semiconducting, metallic, or dielectric nanocrystals (quantum dots). A charge storage layer 210 employing one or more localized charge traps or a plurality of discrete charge storage elements, such as nanocrystals, is broadly referred to as a localized charge storage layer.

Nanocrystals are small clusters or crystals generally having a size in the range of from about 1 nm to about 100 nm. Generally, nanocrystals suitable for use as charge storage elements have a size in the range of from about 1 nm to about 10 nm. The desired size may depend on the composition of the nanocrystals. For example, nanocrystals formed of a metal such as ruthenium (Ru) which has a high work function are preferably about 5 nm in size or less.

Preferably, the nanocrystals are formed from conductive materials. For example, the nanocrystals may include one or more metallic elements, such as Al, Ti, V, Cr, Mn, Fe, Co, Ni, Cu, Zn, Zr, Nb, Mo, Ru, Rh, Pd, Ag, Cd, In, Sn, Hf, Ta, W, Re, Os, Ir, Pt, Au, Hg, Ti, Pb, Y, La, Ce, Pr, Nd, Sm, Eu, Gd, Tb, Dy, Ho, Er, Tm, Yb, or Lu. Such materials may have a higher work function (e.g., about 4.5 eV or higher) than many semiconductors such as silicon, which is desirable for multiple electron storage. They may also have a higher melting point (which allows a higher thermal budget), longer retention times, and a high density of states for both positive and negative charge storage. The nanocrystals may also include one or more semiconducting or semimetallic elements, such as, for example, Si, Ge, As, Sb, Se, Te, or Bi.

In an exemplary embodiment, the nanocrystals of the charge storage layer 210 are small clusters or crystals of a conductive material that are electrically isolated from one another. One advantage of using nanocrystals for the charge storage layer 210 is that they do not form a physically contiguous film, and thus a charge storage layer 210 formed of nanocrystals is self-isolating. Because nanocrystals form a noncontiguous film, charge storage layers may be formed without concern about shorting of the charge storage medium of one cell level to the charge storage medium of adjacent cells lying directly above or below (i.e., vertically adjacent). Yet another advantage of the use of nanocrystals for charge storage layers is that they may experience less charge leakage than do contiguous charge storage media. A memory device incorporating a charge storage layer according to the present disclosure may maintain a constant programmed state over a much longer time than conventional memory devices.

A charge storage layer 210 including discrete charge storage elements such as nanocrystals may be formed using any of a number of deposition processes, such as chemical vapor deposition (CVD), atomic layer deposition (ALD) or physical vapor deposition (PVD), as is known in the art. For example, a charge storage layer including metallic nanocrystals may be formed by a sputtering process in which a thin film is first deposited on a surface of a substrate and then annealed at high temperature (e.g., about 900 degrees C. or higher) for a short time (e.g., about 10 seconds) to coalesce metallic particles of nanoscale dimensions. Such a heating process may be referred to as rapid thermal annealing (RTA). The uniformity and size of the metallic particles can be controlled by varying the thickness of the sputtered metal layer, the annealing temperature and annealing time, pressure, and ambient gas species, etc. When silicon nanocrystals are used as discrete charge storage elements, the silicon nanocrystals may be formed by a process such as CVD as described, for example, in U.S. Pat. No. 6,297,095, which is hereby incorporated by reference in its entirety.

The discrete charge storage elements may be preformed, in other words, fabricated prior to deposition, by colloidal (wet-chemical) methods, vapor condensation techniques, mechanical attrition or any other method known in the art for forming particles in the nanoscale size regime, such as that disclosed in U.S. application Ser. No. 11/506,769, filed Aug. 18, 2006, the disclosure of which is hereby incorporated by reference in its entirety. In addition to the above-mentioned methods, the nanocrystals may be deposited on or embedded into an underlying dielectric layer by spin coating, spray coating, dip coating, printing, chemical self-assembly, ion implantation, aerosol techniques, nano-imprinting using polymer self-assembly and the like, such as described in U.S. Pat. No. 6,586,785, U.S. application Ser. No. 11/147,670, and U.S. application Ser. No. 11/495,188, each of which is hereby incorporated by reference in its entirety. For example, the discrete charge storage elements may be silicon islands disposed within a silicon dioxide dielectric layer. It is also contemplated that a dielectric layer including discrete charge storage elements embedded therein may be formed by applying a dielectric matrix precursor including preformed nanocrystals onto the substrate, and curing, drying, polymerizing, or otherwise processing the dielectric matrix precursor to form a dielectric layer with embedded charge storage elements.

A charge storage layer 210 including one or more localized charge traps may be a nonconductive nitride layer. According to this embodiment, the gate stack 120 may include a first oxide layer as the tunneling dielectric layer 205 adjacent to channel region 115, a nitrogen-containing layer as the charge storage layer 210 adjacent to the first oxide layer, and a second oxide layer as the control dielectric layer 215 adjacent to the nitride layer and adjacent to the gate electrode 125. Such a dielectric stack is sometimes referred to as an ONO stack (i.e., oxide-nitride-oxide) stack. For further description of nitride-based charge storage layers, refer to U.S. Pat. No. 5,768,192, which is hereby incorporated by reference in its entirety. One or both of the oxide layers may be formed of $Al_2O_3$ or other high-k dielectric material. Preferably, the nonconductive nitride layer comprises silicon nitride (e.g., $Si_3N_4$). Other nitrides, such as non-stoichiometric silicon nitride or silicon oxynitride ($SiO_xN_y$, wherein x and y are positive numbers, 0.8, 1.5, etc.), may also be suitable for the charge storage layer 210. Other suitable charge trapping dielectric films, such as an H+ containing oxide film, may be used if desired.

According to an embodiment in which the charge storage layer 210 is made from a nitrogen compound, the nitrogen-containing layer may be formed by adding nitrogen (e.g., "nitriding") or a nitrogen-containing compound to the charge storage layer 210 (e.g., which may be $SiO_2$). In an exemplary embodiment where silicon oxynitride is utilized as the charge storage layer 210, the concentration of nitrogen within the silicon oxynitride may be greater than about 5%, for example. The nitrogen-containing layer may be formed in a chemical vapor deposition process (CVD) from the reaction of such gases as silane (or other silicon source precursor such as dichlorosilane, or disilane) and ammonia (or other nitrogen species such as plasma-ionized nitrogen, $N_2O$ or NO), or from a surface reaction to a reacting gas such as ammonia (or other nitrogen species such as plasma-ionized nitrogen, $N_2O$ or NO). Dichlorosilane and ammonia gas in combination with a co-flow of some inert gas and oxygen-containing gas may be used for growth of the nitrogen-containing layer. In an exemplary embodiment, the nitrogen or nitrogen-containing compound may be deposited on the tunneling dielectric layer 205 using low pressure CVD (LPCVD) or ultra high vacuum CVD (UHVCVD). UHVCVD of the barrier layer 305 may be more controllable than LPCVD, as the UHVCVD generally occurs more slowly, and therefore the growth rate may be more closely regulated. The nitrogen-containing layer may be in direct contact with the tunneling dielectric layer 205.

Figure 4:
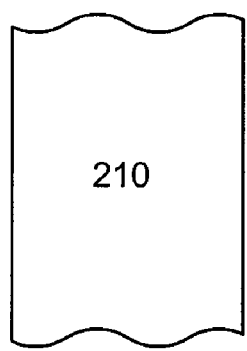
FIG. 4 is a plan view of a contiguous charge storage layer according to one embodiment.
Figure 5:
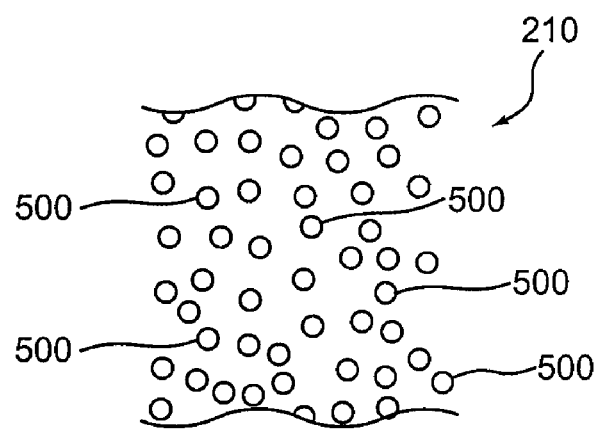
FIG. 5 is a plan view of a noncontiguous charge storage layer including discrete charge storage elements according to another embodiment.

In some exemplary embodiments of the memory device 100, the charge storage layer 210 includes a single continuous charge storage region. For example, the charge storage layer 210 may be formed from a contiguous film of silicon (or polysilicon), a metal, etc., as shown in FIG. 4. In such a configuration, if a single point of the continuous charge storage region breaks down and begins to lose charge, the entire region may lose its charge, causing the memory device 100 to lose its programmed state. However, some embodiments may offer some protection from this problem. For example, FIG. 5 shows a plan view of the charge storage layer 210 including discrete charge storage elements, according to an exemplary embodiment. In the example of FIG. 5, the charge storage layer 210 comprises a plurality of nanoparticles 500. As discussed above, because the nanoparticles 500 of the charge storage layer 210 each separately store charge, and are insulated from one another, even if a single nanoparticle loses charge, this may not affect the remaining nanoparticles of the charge storage layer 210. In another embodiment, the charge storage layer 210 may include one or more localized charge trap regions that may provide similar benefits, despite being a contiguous film. Thus, a memory device 100 incorporating a charge storage layer 210 according to the present disclosure may maintain a constant programmed state over a much longer time than conventional memory devices.

According to an exemplary embodiment where the charge storage layer is a contiguous film, a desired thickness for the charge storage layer 210 is less than about 20 nm. Preferably, the thickness is about 10 nm or less. Even more preferably, the thickness is about 5 nm or less. The thickness of the charge storage layer 210 should be at least that required to ensure generally uniform coverage of the tunneling dielectric layer 205, according to this embodiment. For example, the charge storage layer 210 may be at least about 0.1 nm in thickness.

Preferably, the tunneling dielectric layer 205 is formed of an oxide. According to an exemplary embodiment, the oxide is $SiO_2$. The tunneling dielectric layer 205 may be formed by thermal oxidation of the substrate 105, which is preferably silicon. For example, a silicon wafer (substrate 105) may be placed in a resistively-heated furnace and exposed to pure dry oxygen or water vapor flowing at a rate of about 1 liter per minute. Thermal oxidation of the silicon and growth of $SiO_2$ generally takes place at temperatures in the range of from about 900 degrees C. to 1200 degrees C. According to other exemplary embodiments, the tunneling dielectric layer 205 may be formed of $Al_2O_3$, $Gd_2O_3$, $HfO_2$, $Hf_xAl_{1-x}O_y$, $HfAlO_3$, $Yb_2O_3$, $Dy_2O_3$, $Nb_2O_5$, $Y_2O_3$, $La_2O_3$, $ZrO_2$, $TiO_2$, $Ta_2O_5$, $SrTiO_3$, $Ba_xSr_{1-x}TiO_3$, $Zr_xSi_{1-x}O_y$, $Hf_xSi_{1-x}O_y$, $Al_xZr_{1-x}O_2$, or $Pr_2O$. The tunneling dielectric layer 205 may include more than one oxide or may include one or more thin nitride layers, according to an exemplary embodiment. Nitrogen or a nitrogen-containing compound may be added to the tunneling dielectric layer 205 as described above in reference to the charge storage layer 210 to form the one or more nitride layers. The tunneling dielectric layer 205 may also include more than one other layers. Preferably, the tunnel dielectric layer 205 has a thickness in the range of from about 0.1 nm to about 10 nm. According to an exemplary embodiment, the tunneling dielectric layer 205 has a thickness in the range of from about 0.5 nm to about 5 nm.

Preferably, the control dielectric layer 215 is formed of an oxide. According to an exemplary embodiment, the control dielectric layer 215 is formed of $SiO_2$. Alternatively, the control dielectric layer 215 may be formed of $Al_2O_3$. According to other exemplary embodiments, the control dielectric layer 215 may be formed of $Gd_2O_3$, $HfO_2$, $Hf_xAl_{1-x}O_y$, $HfAlO_3$, $Yb_2O_3$, $Dy_2O_3$, $Nb_2O_5$, $Y_2O_3$, $La_2O_3$, $ZrO_2$, $TiO_2$, $Ta_2O_5$, $SrTiO_3$, $Ba_xSr_{1-x}TiO_3$, $Zr_xSi_{1-x}O_y$, $Hf_xSi_{1-x}O_y$, $Al_xZr_{1-x}O_2$, or $Pr_2O$. The control dielectric layer 215 may include more than one oxide, according to an exemplary embodiment. The control dielectric layer 215 may also include more than one layer. For example, the control dielectric layer 215 may have a double-layer or triple-layer structure that includes a dielectric layer and one or more charge blocking layers. The charge blocking layers may be formed of a Hf-containing compound. According to an exemplary embodiment, the double-layer structure may include $Al_2O_3$ and a layer of a hafnium-containing compound such as $HfO_2$ between the $Al_2O_3$ and the charge storage layer. The layer of $HfO_2$ may suppress a tunneling current from the charge storage layer of the memory cell to the control gate during programming operations. An exemplary triple-layer structure may include a first layer of a hafnium-containing compound such as $HfO_2$ (or $Hf_{1-x}Al_xO_y$, where x is a positive number between 0 and 1, and y is a positive number, e.g., $HfAlO_3$) adjacent to the charge storage layer of the device, a second layer of a hafnium containing compound such as $HfO_2$ adjacent to the gate electrode of the memory cell, and a layer of $Al_2O_3$ between the first and second layers of $HfO_2$. The second layer of $HfO_2$ may block electron current from the control gate to the charge storage layer during the erase operation of the memory cell. Alternatively, the double- or triple-layer structure may include $SiO_2$, or another oxide, in place of the $Al_2O_3$.

The control dielectric layer 215 may be formed by vapor deposition techniques known in the art, including, for example, CVD, PVD, or ALD. Preferably, the control dielectric layer 215 has a thickness in the range of from about 0.1 nm to about 20 nm. According to an exemplary embodiment, the control dielectric layer has a thickness in the range of from about 0.5 nm to about 10 nm.

As described above, the tunneling dielectric layer 205 and the control dielectric layer 215 may be a single layer, according to an embodiment in which the charge storage layer 210 includes discrete charge storage elements, such as nanocrystals.

A method to fabricate a gate electrode having curved or sloped edge configurations is described below. FIGS. 6A-6F show a first embodiment of the method in which the memory cell is viewed in cross-section along the word line direction, and FIGS. 7A-7G show a first embodiment of the method in which the memory cell is viewed in cross-section along the bit line direction. FIGS. 8A-8F show a second embodiment of the method as viewed along the word line direction. The cross sections corresponding to the bit line direction (BL) and word line direction (WL) are demarcated in FIG. 9, which presents a plan view perspective of two adjacent memory cells 100. The bit line direction is substantially orthogonal to the word line direction.

Figure 6A:
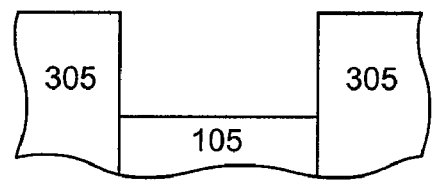
FIGS. 6A-6F show a first embodiment of the method as viewed along the word line direction.
Figure 8A:
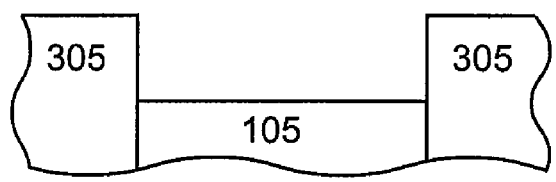
FIGS. 8A-8F show a second embodiment of the method as viewed along the word line direction.
Figure 9:
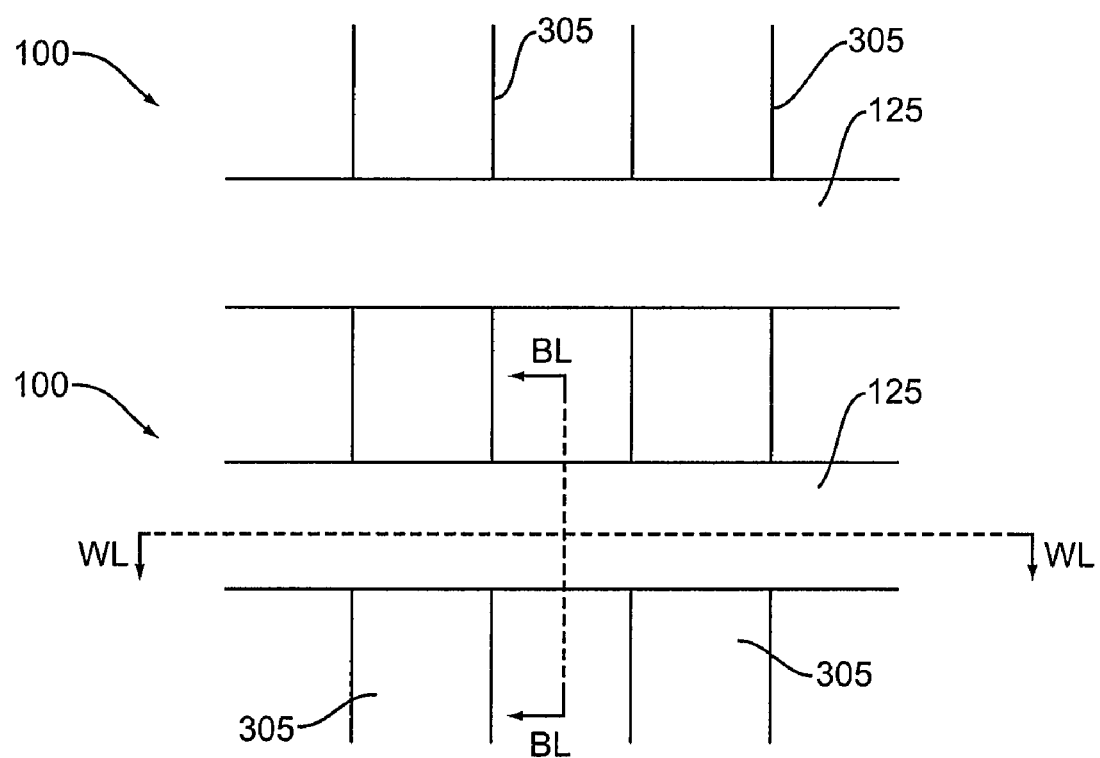
FIG. 9 shows a plan view of two adjacent memory cells.

The method may include a first step of forming isolation structures disposed apart from each other. The isolation structures may be formed using shallow trench isolation (STI) technology known in the art, except that the final isolation structures preferably protrude from the substrate. The process entails depositing a nitride layer, such as silicon nitride, on the substrate (e.g., silicon) using low pressure chemical vapor deposition (LPCVD) or another suitable deposition technique. The thickness of the deposited layer may range from about 5 to 100 nm, depending on the desired height of the isolation structures. Photoresist is applied to the nitride layer and a first mask is used to pattern the regions where first isolation structures are to be formed. The nitride is then anisotropically etched to form etched nitride structures using, for example, a plasma etching process carried out in a dry etcher designed for etching dielectric materials. Next, an oxide layer is deposited by chemical vapor deposition (CVD) or another suitable deposition technique to cover the etched nitride structures and to fill in the regions between the nitride structures. Thermal oxidation may be employed to grow a liner oxide prior to depositing the oxide layer. Chemical-mechanical polishing (CMP) is then employed to planarize the surface and remove the oxide overlying the nitride structures. The etched nitride structures serve as a stop layer for the CMP process. The first isolation structures 305 are thus formed from the regions containing oxide, as shown in FIGS. 6A and 8A. As shown in FIG. 9, they are spaced apart from each other in the word line direction, and they extend along the bit line direction. The first isolation structures 305 have a trench structure extending into the substrate 105. Accordingly, they may isolate active regions of adjacent memory cells 100 from each other along the word line direction.

Figure 7A:
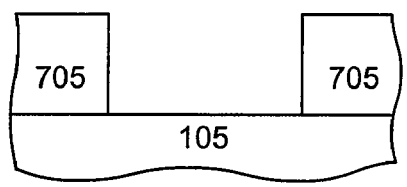
FIGS. 7A-7G show a first embodiment of the method as viewed along the bit line direction.

Photoresist is applied to the first isolation structures 305 and the nitride structures, and a second mask is used to pattern the structures for selective removal of a portion of the nitride structures by anisotropic etching. Discrete second isolation structures 705 are thus formed from the remaining nitride structures, as shown in FIG. 7A. The second isolation structures 705 are preferably spaced apart from each other along the bit line direction and disposed in regions between adjacent first isolation structures 305. In some embodiments, the second isolation structures 705 may not be formed.

Figure 6B:
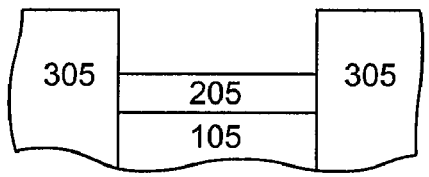
Figure 6C:
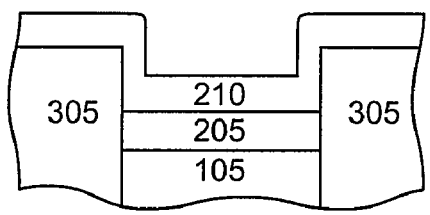
Figure 6D:
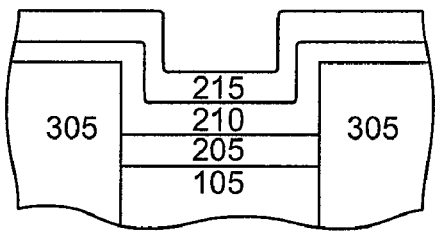
Figure 6F:
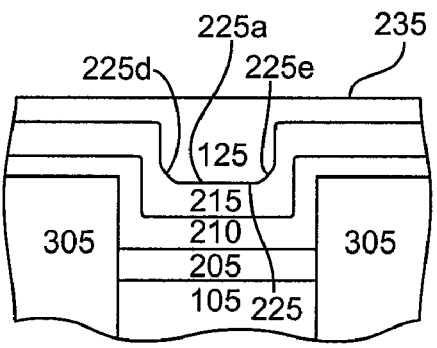
Figure 7B:
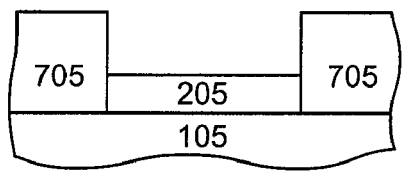
Figure 7C:
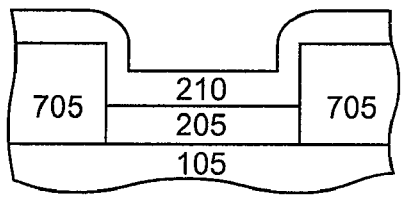
Figure 7D:
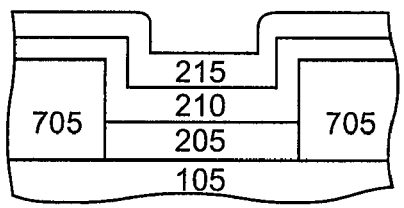
Figure 7F:
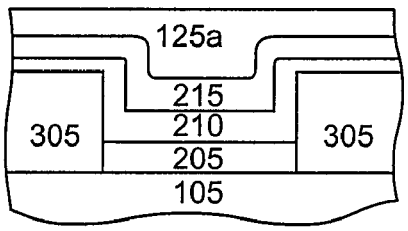
Figure 8B:
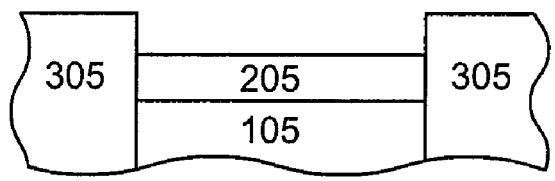
Figure 8C:
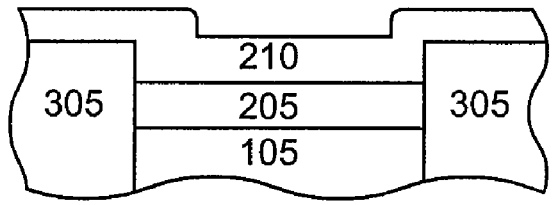
Figure 8D:
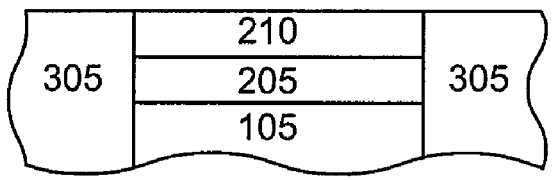
Figure 8E:
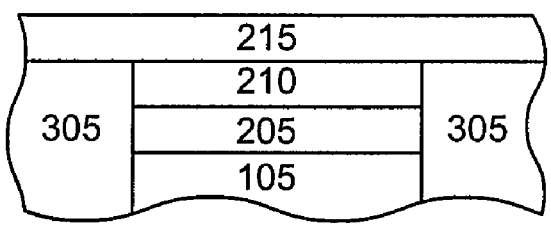
Figure 8F:
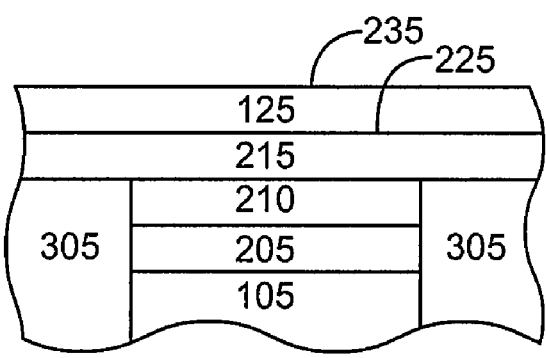

After the isolation structures are formed, a tunneling dielectric layer 205 (e.g., $SiO_2$) may be thermally grown on the substrate 105 to a thickness of typically about 2-10 nm, as shown in FIGS. 6B, 7B, and 8B. The upper surface of the tunneling dielectric layer (e.g., $SiO_2$) may be nitrided (e.g., converted to silicon nitride) as described above. The charge storage layer 210 may then be formed on the tunneling dielectric layer 205 as described above and as shown in FIGS. 6C, 7C, and 8C. The charge storage layer 210 may be self-isolating due to the discontinuous or localized nature of the charge storage elements. Accordingly, it may be acceptable to have a charge storage layer 210 that is continuous across adjacent memory cells along the word line direction, as shown in FIGS. 3A-3B and in FIGS. 6F and 7F, for example. Alternatively, the charge storage layer may be removed (e.g., by patterning and etching) in the regions above the first isolation structures 305 prior to deposition of overlying layers in order to isolate the charge storage layer 210 from the charge storage layers of adjacent memory cells, as shown, for example, in FIGS. 8C-8D.

A control dielectric layer 215 may then be formed on the charge storage layer, as described above and as shown in FIGS. 6D, 7D, and 8E. According to some exemplary embodiments, the tunneling dielectric layer 205 and the control dielectric layer 215 may be a single dielectric layer 900 with discontinuous charge storage elements (e.g., nanocrystals 500) embedded therein, as shown in FIGS. 10B-10C, in which case the control dielectric layer 215 may not formed in a separate step.

Figure 6E:
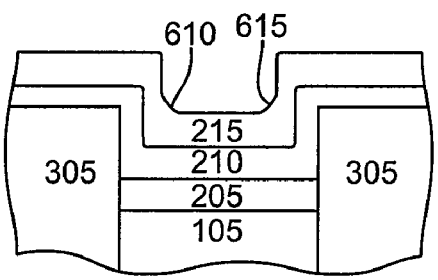
Figure 7E:
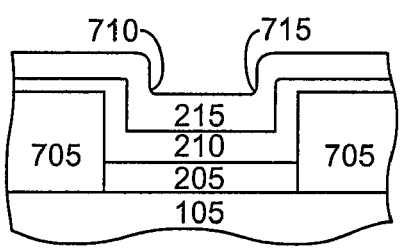

Referring to FIGS. 6E and 7E, the control dielectric layer 215 may be etched to round out or taper interior junctions of the layer, thereby creating blunt interior junctions 610, 615, 710, 715. These junctions 610, 615, 710, 715 of the control dielectric layer 215 may be used to form blunt interior junction regions (e.g., regions 225d and 225e of FIGS. 3A-3B) or edges (e.g., edges 225b, 225c of FIGS. 2A-2B) of the gate electrode 125 in subsequent steps. The blunt interior junctions 610, 615 shown in FIG. 6E extend along the bit line direction (into the page). The blunt interior junctions 710, 715 shown in FIG. 7E extend along the word line direction (into the page). Suitable etching techniques are described below. Referring to the embodiment of the method shown in FIG. 8E, it can be seen that it may not be necessary to create the blunt interior junctions.

As shown in FIG. 7F, which shows a cross-sectional view of the memory cell along the bit line direction, a gate electrode layer 125*a* may then be deposited on the control dielectric layer 215 using any suitable deposition technique, such as, for example, atomic layer deposition, sputtering, or CVD. Upon deposition, a lower surface 225*a* of the gate electrode layer 125*a* in contact with the control dielectric layer 215 conforms to the shape of the control dielectric layer 215. Accordingly, the gate electrode layer 125*a* includes blunt interior junction regions that become divergent edges 225*b*, 225*c* of the gate electrode 125 once the gate electrode layer 125*a* and the underlying layers are anisotropically etched.

Similarly, as shown in FIG. 6F along the word line direction, a gate electrode layer may be deposited on the control dielectric layer 215 as described above to form a gate electrode 125 including blunt interior junction regions 225*d*, 225*e*.

A midsection 225*a* of a lower surface 225 of the gate electrode 125 and an opposing upper surface 235 of the gate electrode 125 are substantially planar and generally aligned with the substrate. The upper surface 235 may undergo a CMP step after deposition of the gate electrode layer 125 for planarization (flattening).

Figure 7G:
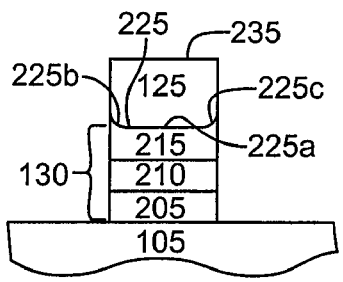

Finally, the gate electrode layer 125*a* and underlying layers may be patterned and etched using anisotropic etching techniques known in the art to form the gate electrode 125 on the gate stack 130, as shown, for example, in FIG. 7G. Consequently, edges 225*b*, 225*c* of the lower surface 225 of the gate electrode 125 extend away from (or diverge from) the midsection 225*a* in the direction of the opposing upper surface 235 of the gate electrode 125. The edges 225*b*, 225*c* extend along a length of the gate electrode 125 in the word line direction (into the page). According to some embodiments, and as shown in FIG. 6F, the lower surface 225 of the gate electrode 125 further comprises blunt interior junctions 225*d*, 225*e* extending along a width of the gate electrode in the bit line direction (into the page). As shown in FIGS. 8A-8F, the blunt interior junctions 225*d*, 225*e* may not be formed.

Figure 10A:
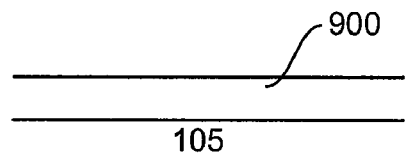
FIGS. 10A-10F show a third embodiment of the method as viewed along the bit line direction.
Figure 10B:
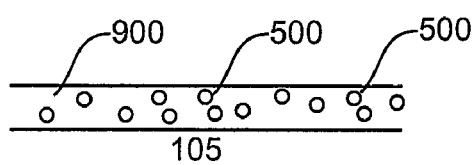
Figure 10E:
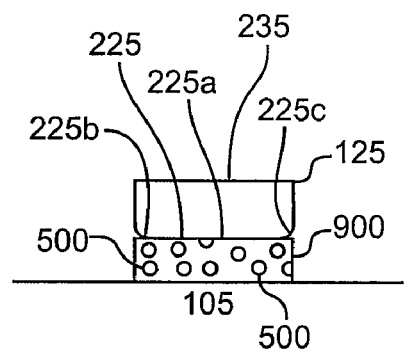
Figure 10C:
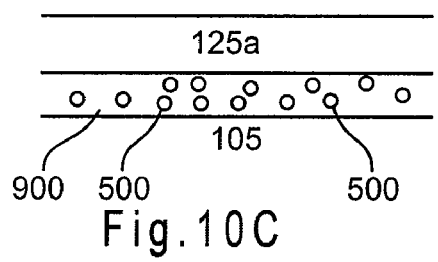
Figure 10F:
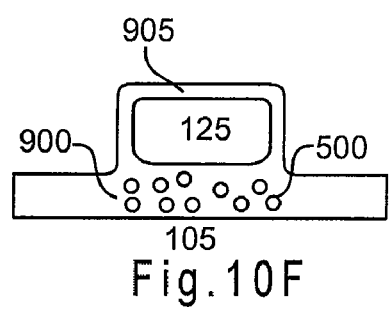
Figure 10D:
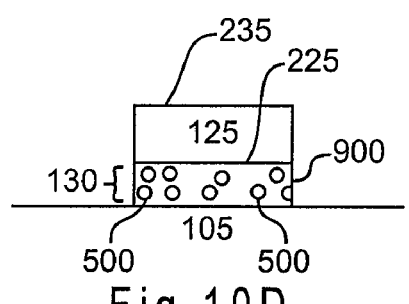

Referring to FIGS. 10A-10G, a method to fabricate a gate electrode having curved or sloped edge configurations is described below according to a third embodiment. The figures show a cross-sectional view of the memory cell along the bit line direction. This embodiment is described for a memory cell that includes discrete charge storage elements (e.g., nanocrystals) dispersed within a single dielectric layer, but may be applicable to memory cells including other types of charge storage elements or layers. The process may include forming first isolation structures, as described previously, and as visible along the word line cross-section (not shown). Next, a dielectric layer 900 (e.g., SiO$_2$) may be thermally grown on the substrate 105 to a thickness of typically about 10-20 nm, as shown in FIG. 10A. Alternatively, the dielectric layer 900 may be deposited by CVD or another suitable deposition technique. Referring to FIG. 10B, nanocrystals 500 may be embedded into the dielectric layer 900 as discussed previously to form the discrete charge storage elements of the discontinuous charge storage layer. The gate electrode layer 125*a* may then be deposited on the single dielectric layer 900 using deposition techniques known in the art, such as, for example, sputtering, atomic layer deposition, or CVD, as shown in FIG. 10C. The gate electrode layer 125*a* may be patterned and etched using anisotropic etching techniques known in the art to form the gate electrode 125 on the gate stack 130, as shown in FIG. 10D. Etching may then be employed to etch out end portions of the lower surface 225 of the gate electrode 125. Consequently, as shown in FIG. 10E, edges 225*b*, 225*c* of the lower surface 225 of the gate electrode 125 extend away from the midsection 225*a* in the direction of the upper surface 235 of the gate electrode 125. An additional dielectric layer 905 may be deposited by any suitable deposition technique (e.g., ALD, CVD, sputtering) to fill in the gaps underlying the edges 225*b*, 225*c*, as shown in FIG. 10F.

A method of making a substrate 105 including curved or tapered channel edges 1105*b*, 1105*c* as shown in FIG. 11, may include etching edges of the substrate adjacent to the isolation structures (STI regions) 305 using etching methods known in the art and described below. Alternatively, curved or tapered channel edges 1105*b*, 1105*c* may be formed during fabrication of the isolation structures 305. For example, thermal oxidation of the silicon to form a liner oxide prior to depositing the oxide layer in the trench structures, as described above, may generate the curved or tapered channel edges 1105*b*, 1105*c*.

Etching techniques known in the art may be employed to form the blunt interior junction and edge configurations described above. Anisotropic etching is preferred for forming blunt interior junctions or edges having a slope. Isotropic etching is preferred for forming blunt interior junctions or edges having a curve. Preferably, dry etching methods are employed. Suitable dry etching methods may include sputter etching (physical etching), plasma etching (chemical etching), and reactive ion etching (physical and chemical etching).

Figure 16:
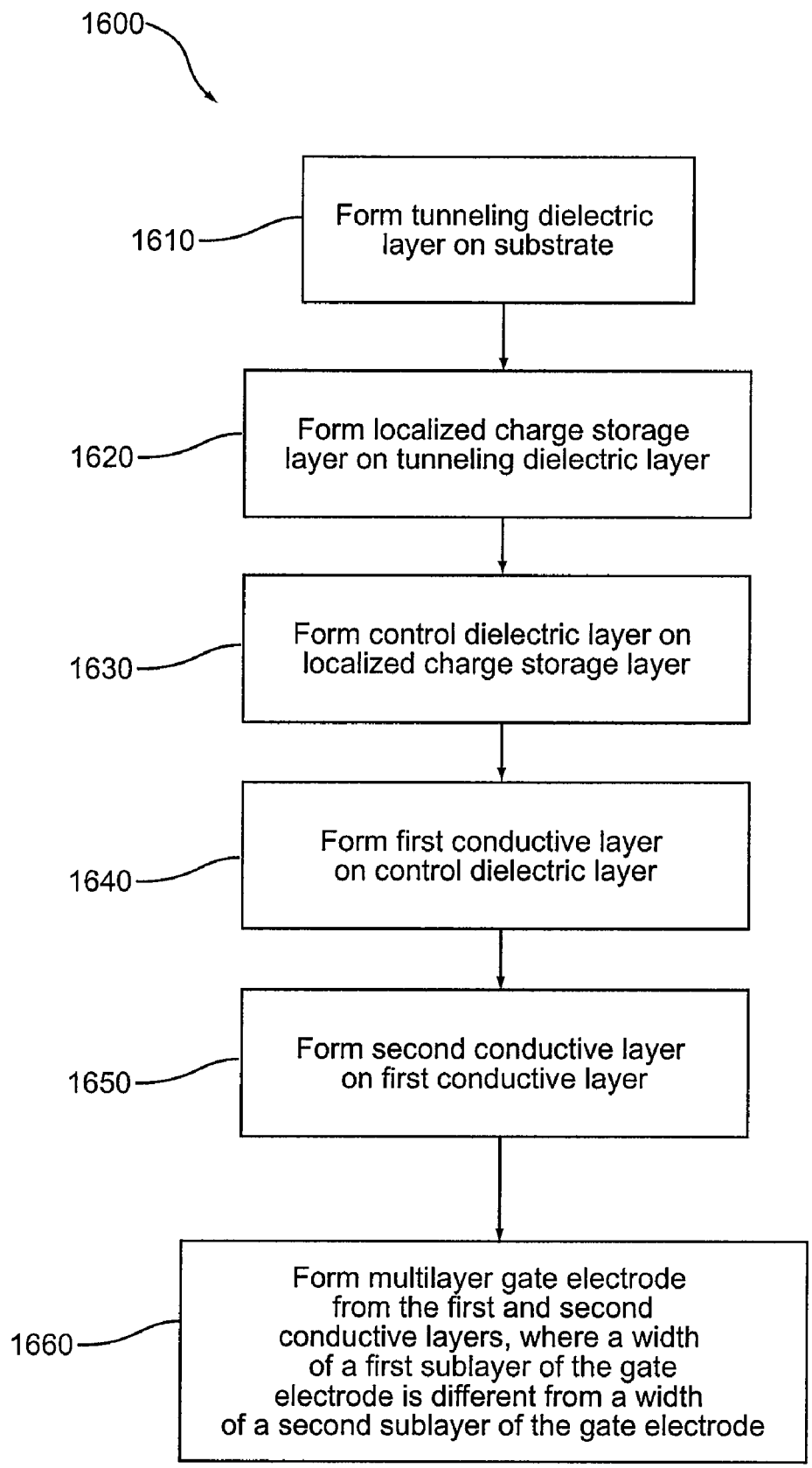
FIG. 16 is a flow chart showing another embodiment of the method.

A method to fabricate a gate electrode including two or more sublayers is also described herein. Preferably, the sublayers of the gate electrode have different widths. Referring to the flow chart in FIG. 16, the method 1600 includes forming a tunneling dielectric layer on a substrate 1610, forming a localized charge storage layer on the tunneling dielectric layer 1620, and forming a control dielectric layer on the localized charge storage layer 1630, as described previously. Next, a first conductive layer may be formed on the control dielectric layer 1640 by a vapor deposition technique known in the art, such as PVD (e.g., sputtering), ALD, or CVD. A second conductive layer may then be formed on the first conductive layer 1650 by vapor deposition. In a final step, a multilayer gate electrode having a first sublayer and a second sublayer may be formed from the first and second conductive layers 1660. The formation of the multilayer gate electrode preferably entails photolithographic patterning and etching methods known in the art. The etching process may entail isotropic or anisotropic etching, although anisotropic etching is preferred. It is also preferable that dry etching methods, such as plasma etching, sputter etching, or reactive ion etching, are employed. As discussed previously, the sublayers of the gate electrode layer preferably have different etch rates and thus can be etched to different widths during a single etching process. Preferably, the etching of the first sublayer of the multilayer gate electrode is carried out at a higher rate than the etching of the second sublayer. Accordingly, following the etching process, the width of the first sublayer of the multilayer gate electrode is preferably smaller than the width of the second sublayer due to the more rapid etching of the former.

It may be desirable to form at least one intermediate conductive layer on the first conductive layer prior to forming the second conductive layer. As with the first conductive layer, the intermediate conductive layer may be formed by a vapor deposition technique known in the art, such as PVD (e.g., sputtering), ALD, or CVD. The second conductive layer may then be vapor deposited on the intermediate conductive layer. A multilayer gate electrode including three or more sublayers may be formed from the first conductive layer, the intermediate conductive layer, and the second conductive layer by etching techniques known in the art, as described above. Preferably, the etching of the intermediate conductive layer is carried out at a higher rate than the etching of the second conductive layer and at a lower rate than the etching of the first conductive layer. Accordingly, following the etching process, the width of the intermediate sublayer of the multilayer gate electrode is preferably greater than the width of the first sublayer and smaller than the width of the second sublayer.

A dielectric layer may be formed on the multilayer gate electrode after etching, thereby filling in any gaps between the control dielectric layer and the multilayer gate electrode. The above described method may be employed to fabricate a gate electrode including any number of sublayers, such as, for example, two, three, four, five or six.

With the configurations described herein, the gate electrode 125, 1225 or the substrate 105 may include gradual transitions instead of sharp junctions at the edges of or within the memory cell. By eliminating such features, locally enhanced electric fields at these sites may be avoided, and the uniformity of the electric field across the memory cell may improve. Consequently, tunneling variations across the memory cell may be reduced. This reduction may be particularly advantageous for memory devices that exploit localized charge storage approaches, such as discrete metal nanocrystals or nitride charge trap regions.

Although the present invention has been described in considerable detail with reference to certain embodiments thereof, other embodiments are possible without departing from the present invention. The spirit and scope of the appended claims should not be limited, therefore, to the description of the preferred embodiments contained herein. All embodiments that come within the meaning of the claims, either literally or by equivalence, are intended to be embraced therein. Furthermore, the advantages described above are not necessarily the only advantages of the invention, and it is not necessarily expected that all of the described advantages will be achieved with every embodiment of the invention.

The invention claimed is:

1. A method of forming a nonvolatile memory cell, the method comprising:
   forming a dielectric layer on a substrate and including discontinuous charge storage elements within the dielectric layer;
   forming a gate electrode layer on the dielectric layer;
   forming a gate electrode from the gate electrode layer, the gate electrode having a length extending in a word line direction and including a first surface adjacent to the dielectric layer, wherein the first surface has a midsection and two edge portions along the length of the gate electrode, the midsection defining a plane and the two edge portions extending away from the plane.

2. A method of forming a nonvolatile memory cell, the method comprising:
   forming a first dielectric layer on the substrate;
   forming a localized charge storage layer on the first dielectric layer;
   forming a second dielectric layer on the localized charge storage layer;
   forming a gate electrode layer on the second dielectric layer;
   forming a gate electrode from the gate electrode layer, the gate electrode having a length extending in a word line direction and including a first surface adjacent to the second dielectric layer, wherein the first surface has a midsection and two edge portions along the length of the gate electrode, the midsection defining a plane and the two edge portions extending away from the plane.

3. The method of claim 2, wherein forming the gate electrode includes etching the first surface of the gate electrode to form the two edge portions.

4. The method of claim 2, further comprising forming a dielectric layer on the gate electrode, thereby filling in any gaps between the second dielectric layer and the two edge portions of the first surface of the gate electrode.

5. The method of claim 2, wherein forming the gate electrode from the gate electrode layer comprises patterning and etching the gate electrode layer, the second dielectric layer, the charge storage layer, and the first dielectric layer.

6. A nonvolatile memory cell comprising:
   a substrate comprising a source, a drain, and a channel between the source and the drain;
   a first dielectric layer overlying the channel;
   a localized charge storage layer between the first dielectric layer and a second dielectric layer;
   a gate electrode having a first surface adjacent to the second dielectric layer and having a length extending in a word line direction, the first surface including a midsection and two edge portions along the length of the gate electrode, wherein the midsection defines a plane and at least one edge portion extends away from the plane.

7. The nonvolatile memory cell of claim 6, wherein the at least one edge portion converges toward an opposing second surface of the gate electrode.

8. The nonvolatile memory cell of claim 6, comprising two edge portions extending away from the plane.

9. The nonvolatile memory cell of claim 6, wherein the at least one edge portion extends away from the plane in a nonlinear manner, the at least one edge portion including a curve.

10. The nonvolatile memory cell of claim 6, wherein the at least one edge portion extends away from the plane in a substantially linear manner, the at least one edge portion having a slope.

11. The nonvolatile memory cell of claim 6, wherein the substrate further comprises a surface adjacent to the first dielectric layer, the surface including a channel midsection and two channel edge portions, wherein the channel midsection defines a first plane and at least one channel edge portion extends away from the first plane.

12. The nonvolatile memory cell of claim 6, wherein the localized charge storage layer comprises nanocrystals.

13. The nonvolatile memory cell of claim 12, wherein the nanocrystals comprise a metal.

14. The nonvolatile memory cell of claim 6, wherein the localized charge storage layer comprises a nitride layer.

15. The nonvolatile memory cell of claim 6, further comprising a third dielectric layer comprising hafnium disposed between the gate electrode and the second dielectric layer.

16. The nonvolatile memory cell of claim 6, further comprising a third dielectric layer comprising hafnium disposed between the second dielectric layer and the localized charge storage layer.

17. The nonvolatile memory cell of claim 6, wherein the first surface of the gate electrode further comprises one or more blunted interior junctions extending along a bit line direction, and wherein the two edge portions of the first surface extend along a word line direction substantially orthogonal to the bit line direction.

18. A nonvolatile memory cell comprising:
- a substrate comprising a source, a drain, and a channel between the source and the drain;
- discontinuous charge storage elements disposed within a dielectric layer overlying the substrate; and
- a gate electrode having a first surface adjacent to the dielectric layer and an opposing second surface, the gate electrode having a length extending in a word line direction, wherein the first surface includes a midsection between two edge portions along the length of the gate electrode, the two edge portions converging toward the opposing second surface.

19. The nonvolatile memory cell of claim 18, wherein the discontinuous charge storage elements are nanocrystals.

20. The nonvolatile memory cell of claim 19, wherein the nanocrystals comprise a metal.

* * * * *